United States Patent [19]
Fattaruso

[11] Patent Number: 5,414,310
[45] Date of Patent: May 9, 1995

[54] ANALOG VOLTAGE MAXIMIZER AND MINIMIZER CIRCUITS

[75] Inventor: John W. Fattaruso, Dallas, Tex.

[73] Assignee: Texas Instruments Incorporated, Dallas, Tex.

[21] Appl. No.: 62,878

[22] Filed: May 17, 1993

[51] Int. Cl.$^6$ .................... H03K 5/153; H03K 5/22
[52] U.S. Cl. ................................. 327/62; 327/71; 327/63
[58] Field of Search ............... 307/475, 355, 357, 351

[56] References Cited

U.S. PATENT DOCUMENTS 4,704,546  11/1987  Mallick, Jr. et al. ............... 307/351

OTHER PUBLICATIONS

Joongho Choi and Bing J. Sheu, "A High-Precision VLSI Winner-Take-All Circuit for Self-Organizing Neural Networks", IEEE Journal of Solid-State Circuits, vol. 28, No. 5, May 1993, pp. 576–584.

Jerzy B. Lont and Walter Guggenbuhl, "Analog CMOS Implementation of a Multilayer Perceptron with Nonlinear Synapses", IEEE Transactions on Neural Networks, vol. 3, No. 3, May 1992, pp. 457–465.

Primary Examiner—Margaret Rose Wambach
Attorney, Agent, or Firm—Peter T. Rutkowski; Richard L. Donaldson; William E. Hiller

[57] ABSTRACT

Voltage minimizer and maximizer circuits are provided for both single-ended and fully-differential analog input voltages. A single-ended analog voltage maximizer circuit includes a plurality of operational amplifiers ($OP_1$, $OP_2$ ... $OP_N$) wherein the number of operational amplifiers corresponds to the number of separate voltages ($V_1$, $V_2$ ... $V_N$) from which a maximum voltage is to be determined, each of the operational amplifiers receives a single-ended analog voltage at its non-inverting input, each output of the plurality of operational amplifiers is connected to a common output line where the maximum analog voltage output ($V_0$) will be received, the common output line is also connected to the inverting input of each of the operational amplifiers. Each operational amplifier also has an operational amplifier circuit (FIGS. 9 and 10) which is configured such that the operational amplifier goes into a completely off mode wherein there is a negligible amount of output current from an output terminal of the operational amplifier, whereby only the amplifier with the maximum analog voltage at its input will be turned on and this particular maximum analog voltage will be seen at the common output terminal. A single-ended voltage minimizer circuit and fully-differential voltage maximizer and minimizer circuits are also disclosed.

8 Claims, 3 Drawing Sheets

ANALOG VOLTAGE MAXIMIZER AND MINIMIZER CIRCUITS

FIELD OF THE INVENTION

The present invention relates to circuits that output the maximum or minimum from among a set of analog input voltages. More particularly, the present invention relates to a circuit including a plurality of operational amplifiers, each receiving a voltage at its input, and which operational amplifiers are configured such that only the maximum input voltage(in a first configuration) or a minimum input voltage(in a second configuration) is received at a common output of the operational amplifiers. The circuits of the present invention may be used in computation tasks, for example fuzzy logic, where the minimum or maximum of a set of voltages is desired.

BACKGROUND OF THE INVENTION

In fuzzy logic systems there is a need for a circuit to generate a voltage that is either the maximum or the minimum from among a set of N input voltages. Consider first an array of source-follower devices $m_1$, $m_2$, . . . and $m_N$ to perform an approximate maximize operation, on a set of input voltages $V_1$, $V_2$, . . . and $V_N$ as shown in FIG. 1. An output voltage $V_0$ will be approximately the maximum of the set of the N input voltages $V_1$ through $V_N$, minus a threshold voltage, for small values of $I_0$ and large values of R. Thus, the source terminal of a source-follower device does not follow the gate voltage precisely and the device has a gain of less than one. Therefore, a static output difference or error arises between the input voltage and the output voltage.

Besides the undesirable threshold voltage drop or static voltage error there is another major cause of non-ideal behavior in the circuit of FIG. 1. When two or more input voltage $V_1$, $V_2$, etc. are close together, the current required by the tail source $I_0$ and load resistor R will flow down through more than one conducting MOS device, i.e. more than one transistor is on at the same time. This means, there will be an erroneous output voltage generated in a transition region when a particular transistor input voltage is gradually assuming its rank as the maximum voltage input level.

To derive a first-order relationship of output voltage to input voltages, from which this error may be clearly seen, consider the case of a somewhat ideal MOS device and its behavior as shown in FIGS. 2A and 2B respectively. Assume the ideal device of FIG. 2A has zero threshold voltage and drain current linearly related to $V_{GS}$ as shown in FIG. 2B. Specifically, assume $I_D = g_m V_{GS}$ for $V_{GS}$ greater than or equal to 0 and $I_D = 0$ for $V_{GS}$ less than 0. Now, look at a simple case of two input voltages $V_1$ and $V_2$ and two corresponding MOS source-followers $m_1$ and $m_2$, as shown in FIG. 3. There are three possible regions of operation on the current $I_D$ vs voltage $V_{GS}$ graph as shown in FIG. 5: transistor $m_1$ conducting current and transistor $m_2$ not, transistor $m_2$ conducting current and transistor $m_1$ not, and both transistors $m_1$ and $m_2$ conducting current.

If transistor $m_1$ is on and transistor $m_2$ is off then:

$$V_1 - V_0 > 0 \text{ and } V_2 - V_0 < 0;$$

$$g_m(V_1 - V_0) = I_0 + V_0/R;$$

which can be solved to find:

$$V_0 = (V_1 - I_0/g_m)/(1 + 1/g_m R),$$

a function that approximately follows $V_1$. Similarly if transistor $m_2$ is on and transistor $m_1$ is off:

$$V_1 - V_0 < 0, V_2 - V_0 > 0 \text{ and}$$

$$V_0 = (V_2 - I_0/g_m)/(1 + 1/g_m R).$$

Now, the case when both transistors $m_1$ and $m_2$ are conducting is governed by $V_1 - V_0 \geq 0$, $V_2 - V_0 \geq 0$ and $$g_m(V_1 - V_0) + g_m(V_2 - V_0) = I_0 + V_0/R;$$

solving for $V_0$ gives $V_0 = (V_1 + V_2 - I_0/g_m)/(2 + 1/g_m R)$, and shows an output voltage function that approximately follows the average of $V_1$ and $V_2$.

Suppose that $V_2$ were fixed at some level and $V_1$ were swept over its maximum range. An ideal maximum-generating circuit would exhibit the characteristic as shown in FIG. 4. In the non-ideal case the two transistor circuit of FIG. 3 would be characterized by the graph shown in FIG. 5.

The width of the transition region(in the center of the graph), when both transistors $m_1$ and $m_2$ are conducting drain current, can be found as follows:

When transistor $M_1$ is on, transistor $m_2$ will start to conduct when $V_0$ falls and reaches $V_2$, so $$V_0 V_2 = (V_1 - I_0/g_m)/(1 + 1/g_m R);$$

solving for $V_1 - V_2$;

$$\blacktriangle V_y = V_1 - V_2 = V_2/g_m R + I_0/g.$$

Similarly when transistor $m_2$ is on, transistor $m_1$ will start to conduct when $V_0$ reaches $V_1$ as it rises, so $$V_0 = V_1 = (V_2 - I_0/g_m)/(1 + 1/g_m R)$$

and then solving for $V_2 - V_1$ gives $$\blacktriangle V_x = V_2 - V_1 = (V_2/g_m R + I_0/g_m)/(1 + 1/g_m R) = \blacktriangle V_y/(1 + 1/g_m R).$$

From the two plots shown in FIGS. 4 and 5, it can be seen that the actual characteristic will approach the ideal one as $g_m$ approaches infinity. This means that there will be perfect following of the maximum voltage and a zero-width transition region as $g_m$ approaches infinity. It is, of course, impractical to expect a circuit to be designed with unlimited device transconductance, and circuit speed will be severely degraded if single device transconductance is made to be extremely large. This also takes a prohibitive amount of die area.

In addition, as described above a circuit is needed which will not exhibit an output voltage that is actually one threshold voltage lower than the maximum input level, as this simple source-follower circuit would, with real MOS devices.

It is therefore an object of the present invention to provide a provide a circuit which can determine the maximum or minimum of a plurality of analog input voltages which can correct for any D.C. offset error between the output voltage and the maximum or minimum input voltage.

It is yet another object of the present invention to provide a circuit which can determine the maximum or minium of a plurality of analog input voltages which circuit can distinguish between input voltages only a few millivolts apart.

It is a further object of the present invention to provide circuits which can determine the maximum or minimum of a plurality of analog input voltages for single-ended input voltages and a separate circuit for determining the maximum or minimum of a plurality of analolog input voltages for fully-differential input voltages.

Other objects of the invention will become apparent to those of ordinary skill in the art having reference to the following specification, in conjunction with the drawings.

SUMMARY OF THE INVENTION

In one aspect of the present invention high-gain operational amplifiers are substituted for the source-follower devices of the prior art. Each operational amplifier is configured such that the amplifier goes into a completely off mode when there is a negligible amount of output current from an output terminal of the operational amplifier. The current invention provides a voltage maximizer or minimizer circuit with a very small transition region and thus ability to select the maximum or minimum of input voltages with a small voltage differences. The present invention also provides a small static output error or the difference between the maximum or minimum input voltage and the output voltage of the circuit. In practice both the transition region and the static output error each may be reduced to millivolts.

DETAILED DESCRIPTION OF THE PREFERRED EMBODIMENT

Figure 3:
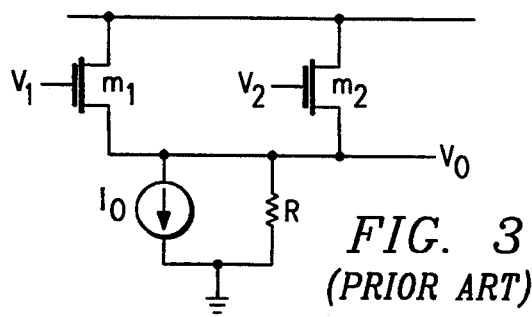
FIG. 3 is a circuit diagram of a maximize circuit having two voltage inputs and corresponding MOS source-followers.
Figure 4:
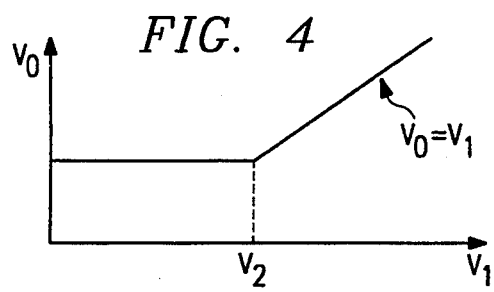
FIGS. 4 and 5 are graphs of the operation of an ideal maximize circuit and the operation of the two voltage input source-follower configuration of FIG. 3.
Figure 5:
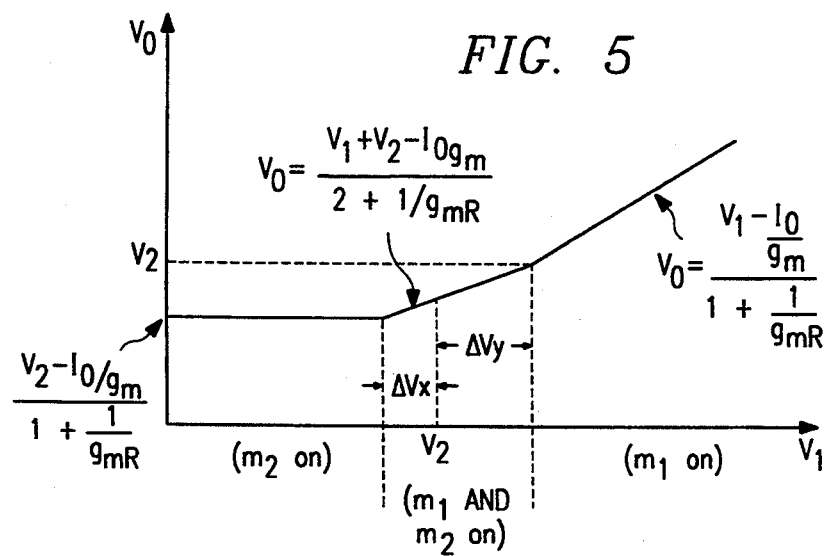
Figure 6:
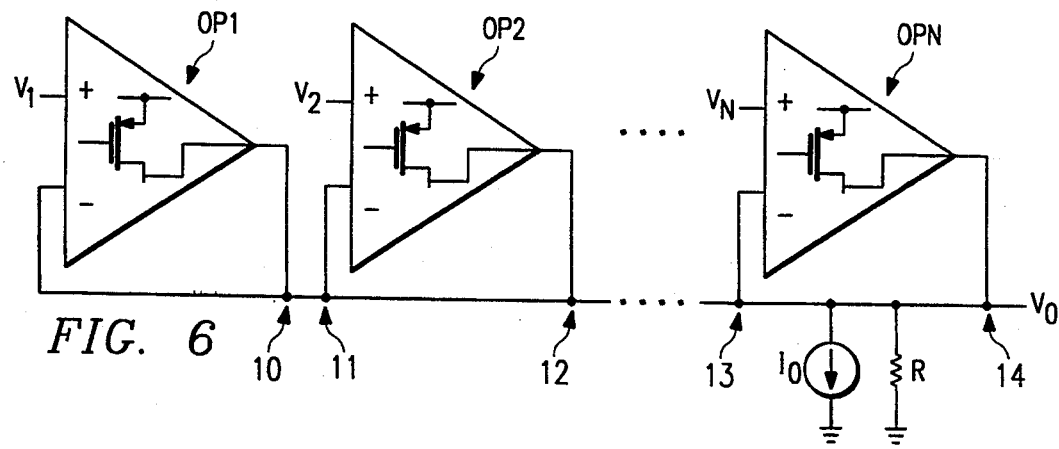
FIG. 6 is a circuit diagram of an operational amplifier maximizing array of the current invention.

When operated as a source follower, a MOSFET such as those shown in FIG. 3, is essentially a single-device feedback loop. An output current is generated that is dependent on the voltage difference between two nodes, and this output current is pushed into a node (the source of the transistor) in such a way that the controlling voltage difference is reduced with larger currents. In addition, the ability for current to flow into the output node in only one direction allows several feedback loops to be wired in parallel to perform a maximization operation. These same principles have been used in the current invention to design an array of feedback loops with circuits related to opamps. In FIG. 6 is shown a circuit for the maximizing array of the current invention. The maximizer circuit of FIG. 6 is used for determining the maximum of a plurality of single-ended input voltages $V_1, V_2 \ldots V_N$. The voltages are received at the (+) terminals of corresponding operational amplifiers $OP_1, OP_2 \ldots OP_N$. The outputs of the opamps are tied to nodes 10, 12, and 14 which nodes share a common line with the output voltage $V_{out}$. The (−) terminals of all the opamps are also connected to the same common line as the various opamp outputs. The opamps of FIG. 6 generate an output current from an open-drain driver, (as described below in conjunction with the opamp circuit of FIG. 9) which current flows down from the positive supply rail and into the output terminal. A small load current $I_0$ is required at the output node, with some finite output resistance R assumed. Since high-gain opamp designs are required, the effective value of the transconductance $g_m$ for each amplifier can be quite large. Typically the gain error term $1/g_m R$ can be easily less than 0.1% and the output current error term $I_0/g_m$ can be on the order of a millivolt. The static offset error due to input offset voltage of the opamps can also be millivolts.

Figure 7:
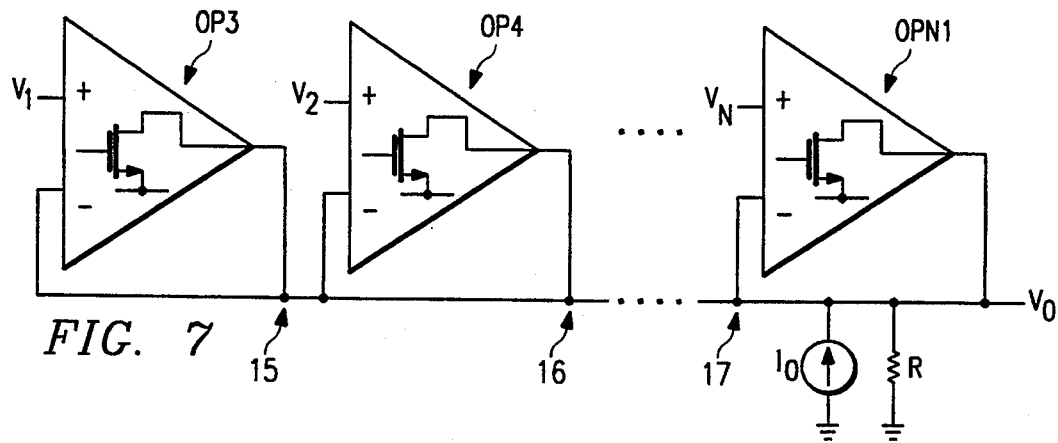
FIG. 7 is a circuit diagram of an operational amplifier minimizing array of the current invention.

As shown in FIG. 7, a single-ended voltage minimizing opamp array can be built with opamps that sink output current through an open-drain driver(as described below in reference to FIG. 10) that flows down into the negative supply rail. The single-ended voltage minimizer array is configured similar to the maximizer opamp array of FIG. 6 with the outputs of the various opamps $OP_3$, $OP_4$ and $OP_{N1}$ being connected to nodes 15, 16, and 17 respectively. These nodes share a common line with the (−) terminals of the various opamps. This minimizer opamp array operates opposite the maximizer array in that only the opamp with the minimum voltage at its input will be on with all the other opamps shut off. In this case, the direction of the bias current generator $I_0$ is reversed relative to the maximizing array of FIG. 6.

Figure 8:
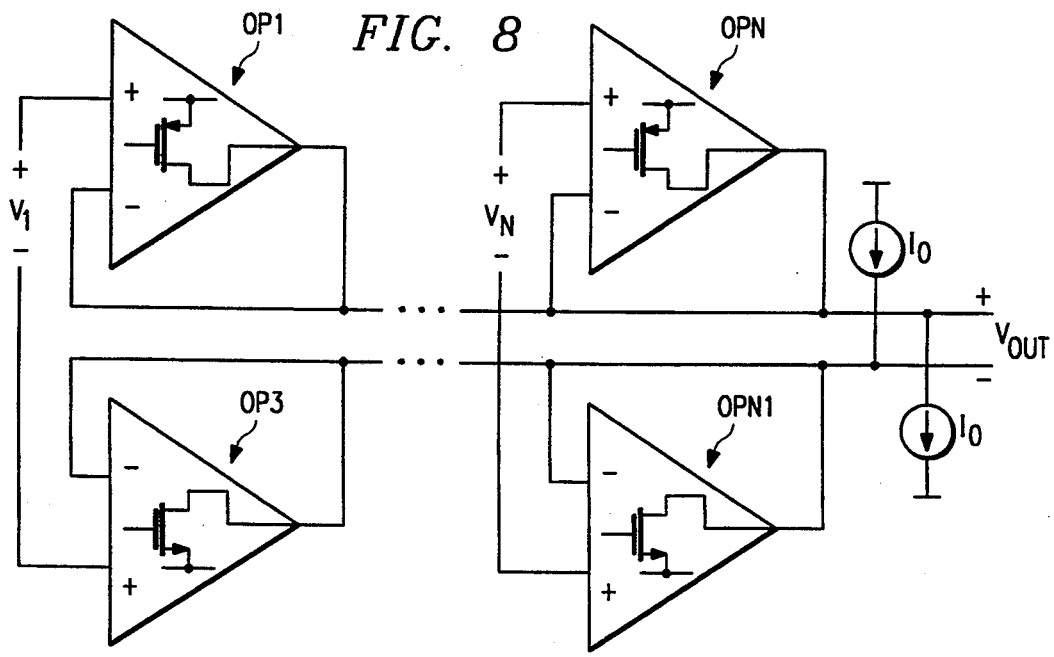
FIG. 8 is a circuit diagram of a fully-differential operational amplifier array.

For fully-differential analog voltage signals, a voltage maximizing array can be built as shown in FIG. 8. This circuit includes an array of opamps $OP_1$ through $OP_N$ which are configured the same as the maximizer array opamps of FIG. 6. These opamps $OP_1$ through $OP_N$ are driven by the positive differential input lines, which then drives the positive differential output line. The circuit of FIG. 8 also includes a second array of opamps $OP_3$ through $OP_{N1}$ which are configured the same as the minimizer array opamps of FIG. 7. These opamps $OP_3$ through $OP_{N1}$ are driven by the negative sides of the differential input lines, which then drives the negative differential output line. By maximizing the positive voltages and minimizing the negative voltages a fully-differential maximum output signal is provided if the common-mode levels for all of the inputs are identical.

In order to provide a voltage minimizer array from a set of fully-differential input voltages, the circuit configuration of FIG. 8 is reversed, i.e. the opamps $OP_1$ through $OP_N$, from the array of FIG. 6, are driven by the negative sides of the differential input lines which then drives the negative differential output line; and the opamps $OP_3$ through $OP_{N1}$, from the array of FIG. 7, are driven by the positive sides of the differential input lines.

The arrays of FIGS. 6 and 7 will work if the opamps are designed to have the open-drain output carry no significant drain current for all large-signal input voltages out of the appropriate active region. This means that the PMOS output devices in the opamps of FIG. 6 will be off when the (+) input of the opamp is at a lower voltage than the (−) input, and that the NMOS devices in FIG. 7 will be off when the opamp (+) input is higher than the (−) input. It is also necessary for the opamps to be output-pole compensated for the entire array to be assured to be stable, that is, the dominant pole in the transfer function for each opamp must be the pole at the open-drain output node.

Figure 9:
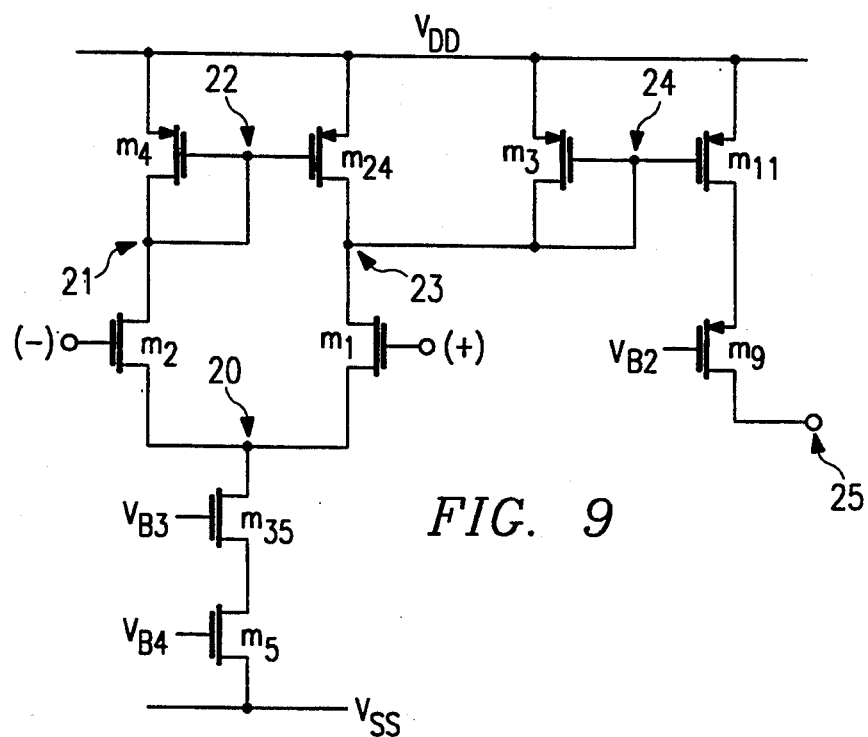
FIG. 9 is a circuit diagram of an operational amplifier for the maximizing array of FIG. 6.
Figure 10:
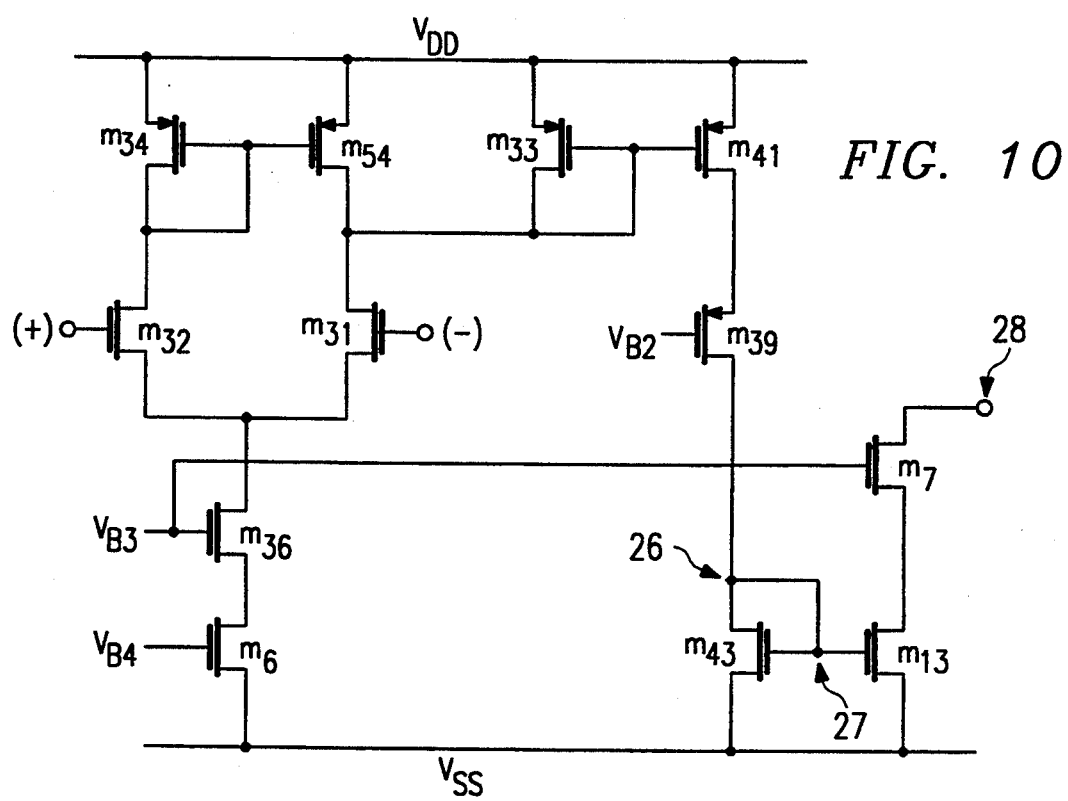
FIG. 10 is a circuit diagram of an operational amplifier for the minimizing array of FIG. 7.

Two opamps which meet these requirements, one for the array in FIG. 6 and another for the array in FIG. 7 are shown in FIGS. 9 and 10 respectively.

In the circuit of FIG. 9 NMOS transistor $m_5$ has its source connected to the negative supply rail $V_{ss}$, its gate connected to voltage $V_{B4}$, and its drain connected to the source of NMOS transistor $m_{34}$. The gate of NMOS transistor $m_{35}$ is connected to voltage $V_{B3}$ and its drain is connected through a common node 20 to the sources of NMOS transistors $m_1$ and $m_2$. Transistor $m_2$ has its gate connected to the (−) input of the opamp circuit and its drain is connected through node 21 to the drain 25 of PMOS transistor $m_4$ and through node 22 to the gates of PMOS transistors $m_4$ and $m_{24}$. The gate of transistor $m_1$ is connected to the (+) input to the opamp and the drain of transistor $m_1$ is connected to the drain of PMOS transistor $m_{24}$ and through node 23 to the drain of PMOS transistor $m_3$. The gates of PMOS transistors $m_3$ and $m_{11}$ are connected through common node 24 to node 23. The sources of transistors $m_4$, $m_{24}$, $m_3$, and $m_{11}$ are all connected to the positive supply rail voltage $V_{DD}$. The drain of transistor $m_{11}$ is connected to the source of PMOS transistor $m_9$. Transistor $m_9$ also has its gate connected to voltage $V_{B2}$ and its drain connected to the opamp output at node 25. Voltages $V_{B2}$, $V_{B3}$, and $V_{B4}$ are externally applied bias voltages. In this circuit transistor $m_5$ is a current source supplying the tail current for the differential pair of transistor $m_1$ and $m_2$. Transistor $m_{35}$ is a cascode device for transistor $m_5$ which raises the output impedance driving the common source terminal 20 of transistors $m_1$ and $m_2$, giving better common mode rejection. Transistors $m_4$ and $m_{24}$ are a current mirror that performs differential to single-ended conversion. Thus the current mirror takes the differential current output of differential pair $m_1$ and $m_2$ and converts it into a single-ended current output that drives a second current mirror comprised of PMOS transistors $m_3$ and $m_{11}$. The current mirrored in transistor $m_{11}$ is the output current. Transistor $m_9$ acts as a cascode device which is added to raise the output impedance of the opamp for higher gain and its open drain provides the output of the opamp circuit of FIG. 9. The opamp of FIG. 9 is designed such that when a large signal input voltage swings the differential pair of transistors $m_1$ and $m_2$, one way or the other hard, i.e. not in the very narrow linear region of the transistors, then an output device that is completely nonconducting is attained. Transistor $m_{11}$ will be completely shut off when the (−) input of the opamp rises above the (+) input. When there is more current conducting in transistor $m_2$ or (−) terminal than in transistor $m_1$ or (+) terminal of the opamp, then the current mirror of transistors $m_4$ and $m_{24}$ is going to raise the voltage at the gate of transistors $m_3$ and $m_{11}$ up to the rail position so that transistor $m_{11}$ is completely shut off. Therefore, the current going down through transistor $m_{11}$ and transistor $m_9$ will be negligible. When the opamps are all connected in a line as in FIG. 6, all but one opamp has its (−) input higher than its (+) input. The common output line connected to all the (−) inputs is going to be dragged up to a high voltage by the one amplifier that is conducting—which one amplifier has the maximum voltage at its (+) input terminal. And thus all the other opamps will be shut off with negligible current at their outputs.

An opamp voltage minimizer circuit is shown in FIG. 10. This circuit is substantially similar to the opamp circuit of FIG. 9 in that transistors $m_5$, $m_{35}$, $m_1$, $m_2$, $m_4$, $m_{24}$, $m_3$, $m_{11}$, and $m_9$ are replaced by transistors $m_6$, $m_{36}$, $m_{31}$, $m_{32}$, $m_{34}$, $m_{24}$, $m_{33}$, $m_{41}$, and $m_{39}$ respectively. In addition, NMOS transistor $m_7$ has its gate connected to the gate of transistor $m_{36}$ and transistors $m_{43}$ and $m_{13}$ have their sources connected to the netative supply rail voltage $V_{ss}$. Transistor $m_{43}$ has its drain connected to the drain of transistor $m_{39}$ through node 26. The gates of transistor $m_{13}$ and $m_{43}$ are connected through common node 27 to node 26. The source of transistor $m_7$ is connected to the drain of transistor $m_{13}$. The drain of transistor $m_7$ is connected to the output node 28 of the opamp circuit of FIG. 10. This circuit is similar to FIG. 9 with the addition of a current mirror comprised of transistors $m_{43}$ and $m_9$ and cascode device $m_7$ added on to the output from transistor $m_9$. Instead the output is taken at the open drain of transistor $m_7$. Therefore, whatever output current comes into output node 28 ends up sinking down toward the negative rail through the current mirror. In addition, in order for the opamp circuit of FIG. 10 to be utilized in the minimizer opamp array of FIG. 7, the polarities at the gates of transistors $m_{31}$ and $m_{32}$ are reversed from the polarities at the gates of transistors $m_1$ and $m_2$, for the maximizer opamp array, because current is now being mirrored in the opposite direction.

An alternate embodiment of an opamp circuit for the voltage minimizer array of FIG. 7 would be provided by simply substituting PMOS transistors for the NMOS transistor in the the opamp circuit of FIG. 9 and likewise substituting NMOS transistor for the PMOS transistors. The input terminals would remain the same. In this circuit configuration the output node of the opamp would sink current into the negative supply rail instead source current from the positive supply rail.

Figure 1:
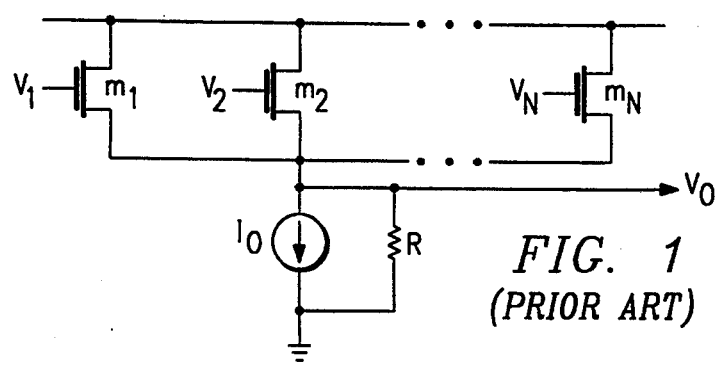
FIG. 1 is a circuit diagram of an array of source-follower devices configured to perform an approximate maximize operation.
Figure 2A:
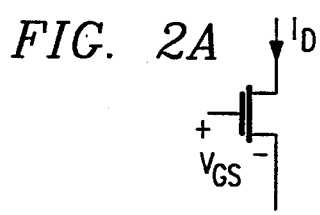
FIGS. 2A and 2B are a circuit diagram of an ideal MOS device and a graph of its corresponding operating characteristics.
Figure 2B:
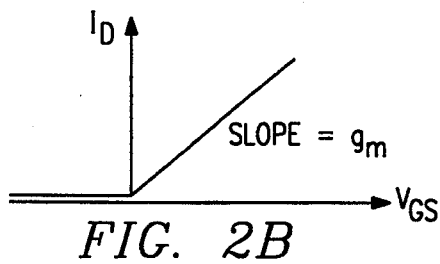

In conclusion, the present invention described above is an improved circuit with both a very small transition region and small static output error. In other words the maximum or minimum of input voltages only a few millivolts apart can be determined precisely and the particular output voltage will be substantially the same as the maximum or minimum input voltage. In practice each may only be millivolts apart. The use of the high-transconductance operational amplifiers of the present invention will greatly improve the precision of the voltage maximization or minimization compared to that possible with arrays of source followers as shown in FIG. 1 of the prior art.

Although the invention has been described in detail herein with reference to its preferred embodiment, it is to be understood that this description is by way of example only, and understood that numerous changes in the details of the invention, will be apparent to, and may be made by, persons of ordinary skill in the art having reference to this description. It is contemplated that such changes and additional embodiments are within the spirit and true scope of the invention as claimed below.

I claim:

1. A single-ended analog voltage maximizer circuit comprising:
   a plurality of high gain operational amplifiers wherein the number of operational amplifiers corresponds to the number of separate voltages from which a maximum voltage is to be determined;
   each of said operational amplifiers receives a single-ended analog voltage at its non-inverting input;
   each output of said plurality of operational amplifiers being connected to a common output line where the maximum analog voltage output will be received;
   said common output line also being connected to the inverting input of each of said operational amplifiers;
   each operational amplifier having an operational amplifier circuit which is configured such that the operational amplifier goes into a completely off mode wherein there is a negligible amount of output current from an output terminal of the operational amplifier, wherein current is sourced from a positive supply rail to the output of the operational amplifier circuit from an open-drain driver, whereby only the amplifier with the maximum analog voltage at its input will be turned on and this particular maximum analog voltage will be seen at the common output terminal.

2. The single-ended voltage maximizer circuit of claim 1 wherein each of the plurality of operational amplifiers has a high voltage gain of approximately 1000 and above.

3. A single-ended analog voltage minimizer circuit comprising:
   a plurality of high gain operational amplifiers wherein the number of operational amplifiers corresponds to the number of separate voltages from which a minimum voltage is to be determined;
   each of said operational amplifiers receives a single-ended analog voltage at its non-inverting input;
   each output of said plurality of operational amplifiers being connected to a common output line where the minimum analog voltage output will be received;
   said common output line also being connected to the inverting input of each of said operational amplifiers;
   each operational amplifier having an operational amplifier circuit which is configured such that the operational amplifier goes into a completely off mode wherein there is a negligible amount of output current from an output terminal of the operational amplifier, wherein current is sinked into a negative supply rail from the output terminal of the operational amplifier through an open-drain driver, whereby only the operational amplifier with the minimum analog voltage at its input will be turned on and this particular minimum analog voltage will be seen at the common output terminal.

4. The single-ended voltage minimizer circuit of claim 3 wherein each of the plurality of operational amplifiers has a high voltage gain of approximately 1000 and above.

5. A fully-differential analog voltage maximizer circuit comprising:
   a voltage maximizing circuit which includes:
      a plurality of high gain operational amplifiers wherein the number of operational amplifiers corresponds to the number of separate voltages from which a maximum voltage is to be determined;
      each of said operational amplifiers receives a single-ended analog voltage at its non-inverting input;
      each output of said plurality of operational amplifiers being connected to a common output line where the maximum analog voltage output will be received;
      said common output line also being connected to the inverting input of each of said operational amplifiers;
      each operational amplifier having an operational amplifier circuit which is configured such that the operational amplifier goes into a completely off mode wherein there is a negligible amount of output current from an output terminal of the operational amplifier, wherein current is sourced from a positive supply rail to the output of the operational amplifier circuit from an open-drain driver, whereby only the amplifier with the maximum analog voltage at its input will be turned on and this particular maximum analog voltage will be seen at the common output terminal;
   a voltage minimizing circuit which includes:
      a plurality of high gain operational amplifiers wherein the number of operational amplifiers corresponds to the number of separate voltages from which a minimum voltage is to be determined;
      each of said operational amplifiers receives a single-ended analog voltage at its non-inverting input;
      each output of said plurality of operational amplifiers being connected to a common output line where the minimum analog voltage output will be received;
      said common output line also being connected to the inverting input of each of said operational amplifiers;
      each operational amplifier having an operational amplifier circuit which is configured such that the operational amplifier goes into a completely off mode wherein there is a negligible amount of output current from an output terminal of the operational amplifier, wherein current is sinked into a negative supply rail from the output terminal of the operational amplifier through an open-drain driver, whereby only the operational amplifier with the minimum analog voltage at its input will be turned on and this particular minimum analog voltage will be seen at the common output terminal;
   each of the operational amplifiers of the voltage maximizing circuit receives the positive side of the fully-differential input voltages and each of the operational amplifiers of the voltage minimizing circuit receives the negative side of the fully-differential input voltages, whereby the voltage on the positive terminals is maximized and the voltage on the negative terminal is minimized and thus the difference between the voltages is ultimately maximized.

6. The fully-differential voltage maximizer circuit of claim 5 wherein each of the plurality of operational amplifiers has a high voltage gain of approximately 1000 and above.

7. A fully-differential analog voltage minimizer circuit comprising:
   a voltage maximizing circuit including:
      a plurality of high gain operational amplifiers wherein the number of operational amplifiers corresponds to the number of separate voltages from which a maximum voltage is to be determined;
      each of said operational amplifiers receives a single-ended analog voltage at its non-inverting input;
      each output of said plurality of operational amplifiers being connected to a common output line where the maximum analog voltage output will be received;
      said common output line also being connected to the inverting input of each of said operational amplifiers;
      each operational amplifier having an operational amplifier circuit which is configured such that the operational amplifier goes into a completely off mode wherein there is a negligible amount of output current from an output terminal of the operational amplifier, wherein current is sourced from a positive supply rail to the output of the operational amplifier circuit from an open-drain driver, whereby only the amplifier with the maximum analog voltage at its input will be turned on and this particular maximum analog voltage will be seen at the common output terminal;
   a voltage minimizing circuit which includes:
      a plurality of high gain operational amplifiers wherein the number of operational amplifiers corresponds to the number of separate voltages from which a minimum voltage is to be determined;
      each of said operational amplifiers receives a single-ended analog voltage at its non-inverting input;
      each output of said plurality of operational amplifiers being connected to a common output line where the minimum analog voltage output will be received;
      said common output line also being connected to the inverting input of each of said operational amplifiers;
      each operational amplifier having an operational amplifier circuit which is configured such that the operational amplifier goes into a completely off mode wherein there is a negligible amount of output current from an output terminal of the operational amplifier, wherein current is sinked into a negative supply rail from the output terminal of the operational amplifier through an open-drain driver, whereby only the operational amplifier with the minimum analog voltage at its input will be turned on and this particular minimum analog voltage will be seen at the common output terminal;
   each of the operational amplifiers of the voltage minimizing circuit receives the positive side of the fully-differential input voltages and each of the operational amplifiers of the voltage maximizing circuit receives the negative side of the fully-differential input voltages, whereby the voltage on the positive terminals is minimized and the voltage on the negative terminal is maximized and thus the difference between the voltages is ultimately minimized.

8. The fully-differential voltage minimizer circuit of claim 7 wherein each of the plurality of operational amplifiers has a high voltage gain of approximately 1000 and above.

* * * * *